United States Patent [19]

Lin et al.

[11] Patent Number: 4,902,899
[45] Date of Patent: Feb. 20, 1990

[54] LITHOGRAPHIC PROCESS HAVING IMPROVED IMAGE QUALITY

[75] Inventors: Burn J. Lin, Scarsdale; Anne M. Moruzzi, Wappingers Falls; Alan E. Rosenbluth, Yorktown Heights, all of N.Y.

[73] Assignee: International Business Machines Corporation, Armonk, N.Y.

[21] Appl. No.: 56,161

[22] Filed: Jun. 1, 1987

[51] Int. Cl.⁴ .............................................. G03F 7/20
[52] U.S. Cl. .............................. 250/492.1; 250/492.2; 430/5; 355/71; 355/125
[58] Field of Search ............. 250/492.2, 492.1, 492.24; 430/4, 5; 355/71, 125

[56] References Cited

U.S. PATENT DOCUMENTS

| | | | |
|---|---|---|---|
| 4,231,811 | 11/1980 | Somekh et al. | 148/1.5 |
| 4,262,070 | 4/1981 | Liu | 430/6 |
| 4,278,755 | 7/1981 | Liu | 430/396 |
| 4,308,326 | 12/1981 | Wirth | 430/6 |
| 4,417,948 | 11/1983 | Mayne-Banton et al. | 156/643 |
| 4,456,371 | 6/1984 | Lin | 355/71 |
| 4,600,666 | 7/1986 | Zink | 430/6 |

FOREIGN PATENT DOCUMENTS

| | | | |
|---|---|---|---|
| 0089742 | 7/1981 | Japan | 430/5 |
| 0202632 | 11/1984 | Japan | 430/5 |
| 557132 | 11/1943 | United Kingdom | 430/5 |

Primary Examiner—Jack I. Berman
Attorney, Agent, or Firm—Pollock, Vande Sande & Priddy

[57] ABSTRACT

A lithographic process having improved image quality by employing a mask that includes a plurality of opaque elements or transparent elements that are smaller than the resolution of the lighography to be employed in order to control the transmittance of the actinic light exposure area.

6 Claims, 5 Drawing Sheets

Imaging Bandwidth
O(f)
Grating Harmonics $-\dfrac{0.5\lambda M}{NA}$   $\dfrac{0.5\lambda M}{NA}$   f Object Spectrum Halftone object spectrum contains error.

LITHOGRAPHIC PROCESS HAVING IMPROVED IMAGE QUALITY

DESCRIPTION

1. Technical Field

The present invention is concerned with a lithographic process that exhibits improved image quality. In particular, the present invention is concerned with lithographic masks that provide regions that at least partially compensate for image degradation caused by the lithographic process itself. The lithographic masks, pursuant to the present invention, have sub-resolution halftones incorporated within the mask patterns for controlling the transmittance of the actinic light exposure area.

2. Background Art

In the fabrication of integrated circuits including integrated circuit chips, one of the most critical and crucial steps is the lithographic processing for providing the desired circuit patterns.

For instance, photolithographic processes involve employing a beam of actinic light, such as U.V. radiation, in order to transfer a pattern from a photolithographic mask onto a photoresist coating through an imaging lens. The mask includes opaque and transparent regions such that the shapes match those of the openings in the resist coating in the desired or predetermined pattern.

In the case of a positive resist coating, the transparent portions of the mask correspond to the desired pattern or image to be provided in the resist coating. When the photoresist coating is a negative resist, the opaque portions or regions of the mask correspond to the subsequent open regions to be provided in the photoresist coating.

However, as the size of the features of the desired pattern approaches the resolution of the photolithographic tool being employed, the contours of the developed regions depart significantly from those in the desired ideal pattern. These departures from, or errors in the pattern, are often pattern-dependent and, accordingly, are difficult to correct with overall changes in the development procedure. Such problems are discussed, for example, in U.S. Pat. No. 4,456,371 to Lin, disclosure of which is incorporated herein by reference.

SUMMARY OF INVENTION

The present invention provides for improved photolithography and improved image quality. In particular, the present invention substantially compensates for image degradation that is caused by the photolithographic process. The present invention is concerned with correcting pattern-dependent errors in photolithographic processes.

In particular, according to the present invention, improved photolithographic processes are obtained by employing a photolithographic mask that contains half tones. The half-tone regions of the photolithographic mask permit partial compensation for the image degradation that is caused by the photolithographic process itself. The half-tone regions are formed from attenuating arrays of opaque or transparent sub-resolution elements.

In particular, the present invention is concerned with a lithographic process having improved image quality. The process includes positioning a member that is to receive an image of a photolithographic mask that defines areas that are to receive actinic light. The member can be adjacent the mask or separated therefrom by some defined distance such as about 500 mm or more having a lens located between the mask and the member. The photolithographic mask includes a plurality of opaque elements or transparent elements or semi-transparent elements, or combinations, each of which being smaller than the resolution of the photolithography to be employed in the imaging. These opaque elements or transparent elements control the transmittance of the actinic light exposure area. Choice of the type of half-tone employed (e.g., transparent or opaque) will depend upon the practical tradeoffs encountered between the write-time for the mask (i.e., number of half-tones) versus the difficulty of fabrication (i.e., polarity-negative or positive resist) of minimum dimensions.

SUMMARY OF DRAWINGS

FIG. 4A illustrates the spectrum of spacial frequencies contained in a grating-like array of halftones.

FIG. 4B illustrates the spectrum of an uncorrected mask pattern.

FIG. 4C illustrates the spectrum of the corrected mask.

BEST AND VARIOUS MODES FOR CARRYING OUT INVENTION

The present invention is concerned with obtaining improved photolithography by employing a mask that contains halftones.

The halftone regions that are present in the photolithographic masks employed pursuant to the present invention provide for substantial compensation for the image degradation that is caused by the photolithographic process itself.

The halftone regions provide for a means of correcting the exposure and patterns containing geometry-dependent degradation.

In particular, the presence of opaque elements or transparent elements in the photolithographic mask that are smaller than the resolution of the photolithography to be employed provide for correction of the exposure to the actinic light by adjusting the transmittance of the corresponding mask opening or portion of the mask opening. In particular, when using opaque elements that are smaller than the resolution of the photolithography to be employed, these opaque elements will not be individually reproduced, but instead, will merely reduce the feature exposure. Correspondingly, finite transmittance can be introduced into a nominally opaque mask pattern by selectively deleting small opaque elements of the mask coating that are smaller than the photolithographic resolution to be employed.

Figure 1:
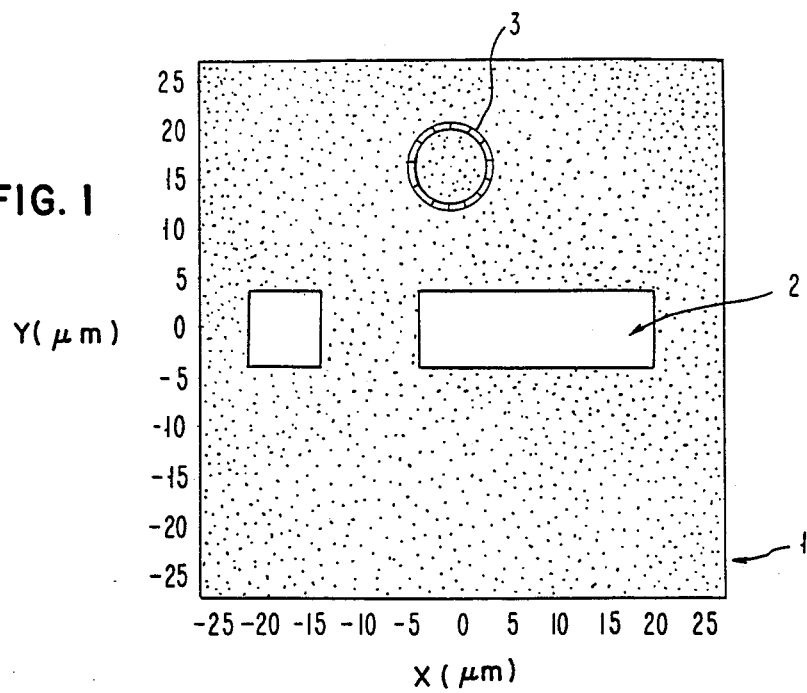
FIG. 1 is a schematic of a conventional mask containing two objects at about $10\times$ magnification.

Reference to FIG. 1 illustrates a conventional photolithographic mask containing two objects. Black areas (1) represent opaque areas of the mask, and white areas (2) represent transparent portions of the mask. The mask is about a 10× magnification. The dotted circle (3) indicates the approximate lithographic resolution for the particular example represented.

Figure 2:
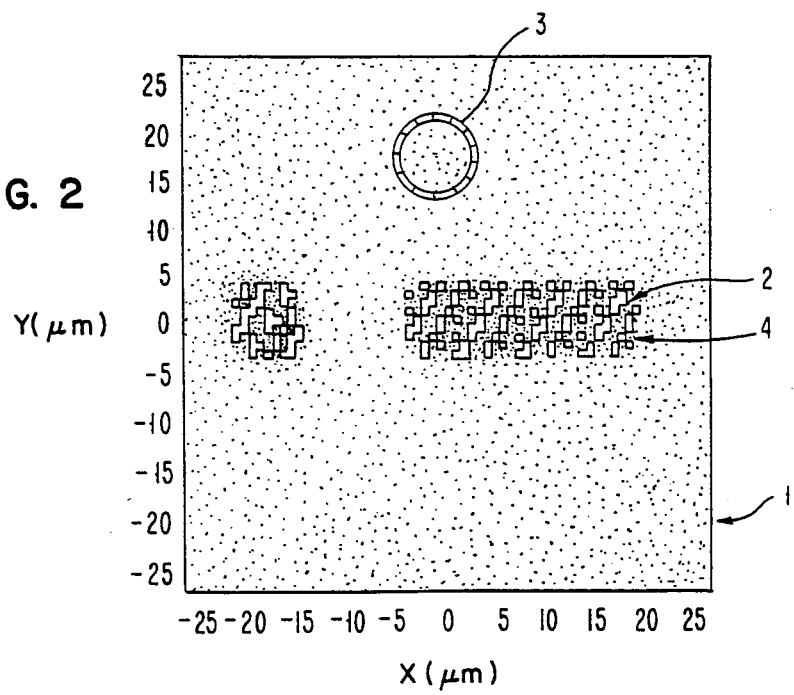
FIG. 2 is a schematic of a halftone mask in accordance with the present invention.

FIG. 2 represents a halftone mask pursuant to the present invention wherein the black portions (1) represent the opaque portions of the mask, the white portions (2) represent the transparent portions of the mask, and the black portions (4) represent the opaque portion being smaller than the resolution of the photolithography to be employed. The dotted circle (3) indicates the approximate photolithographic resolution in the example.

As illustrated in FIGS. 3A-3D, the quality of the photolithographic images is significantly improved by adjustment of the total feature exposure.

In particular, for the particular photolithography illustrated, a three-quarter micron optical photolithography employing a diffraction-limited lens is employed between the masks and the wafer, the wafer being at the imaging side of the lens. The lens numerical aperture ($NA_{wafer}$) is about 0.28, the wavelength is about 436 nanometers, the reduction is about 10×, and the pupil filling ratio $\sigma$ is about 0.7. The approximate resolution of the system is $r_{mask} = 10 \times r_{wafer}$ which equals $10 \times (0.5\lambda/NA_{wafer}) = 7.8$ microns. The desired pattern, as illustrated in FIG. 1, consists of two objects (i.e., two clear apertures in a binary mask), a 7.5 micron square opening (contact hole), and a 7.5×25 micron rectangular opening (line). The corresponding wafer-plane dimensions are reduced by a factor of about 10.

In this example, the lens resolution $r_{mask}$ (illustrated as a dotted circle (3) in FIGS. 1 and 2) is comparable to the minimum feature dimension of 7.5 microns. The limited resolution causes a loss in sharpness in exposure latitude for both features. Such also causes a reduction in the exposing intensity actually transmitted to the wafer underlying the mask. It is further noted that the shape of the contact hole is such that it approaches the resolution limit in both dimensions. This, in turn, causes the contact hole exposure to be lower than that of the line when a conventional mask is employed.

Figure 3A:
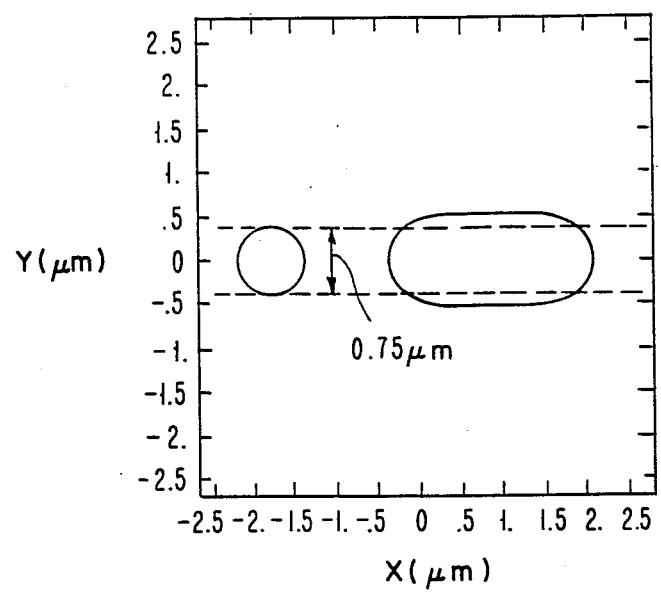
FIGS. 3A and 3B represent images provided by the conventional mask of FIG. 1.
Figure 3B:
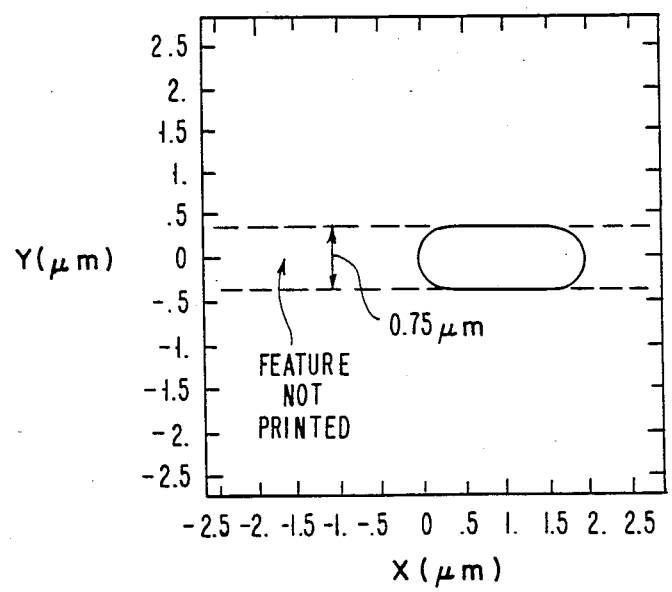

FIGS. 3A and 3B illustrate images printed with the conventional mask from FIG. 1. The contours of each printed circuit are calculated using a computer simulation of the image projected by a partially coherent lens system as discussed by Rosenbluth, et al., "A Critical Examination of Sub-micron Optical Lithography Using Simulated Projection Images", Journal Vacuum Science Technology B1(4), p. 1190 (1983), disclosure of which is incorporated herein by reference. Developing of the resist sufficient to bring the diameter of the contact hole to the desired 0.75 micron value results in overdeveloping the line by about 35% in the critical 0.75 micron dimension. On the other hand, using the conventional mask, development of the line to the correct width results in underexposure or underprinting of the contact hole because of its lower exposure, as illustrated in FIG. 3B.

Figure 3C:
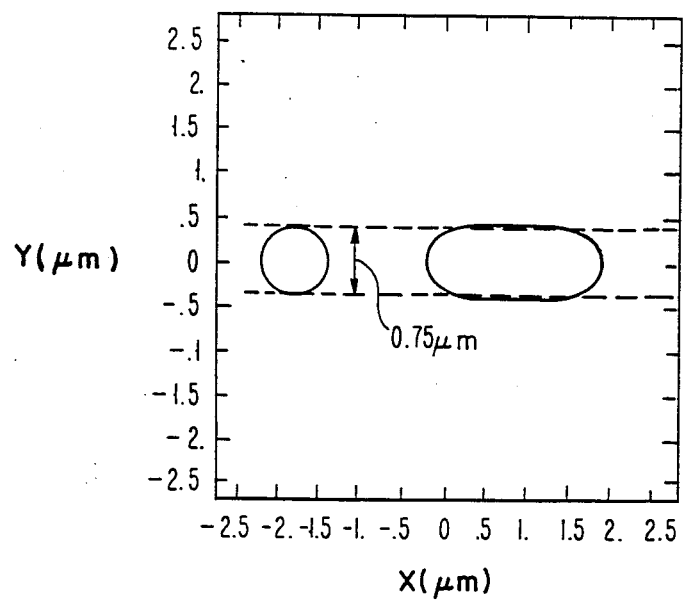
FIGS. 3C and 3D illustrate images provided by the halftone mask in accordance with the present invention illustrated in FIG. 2.
Figure 3D:
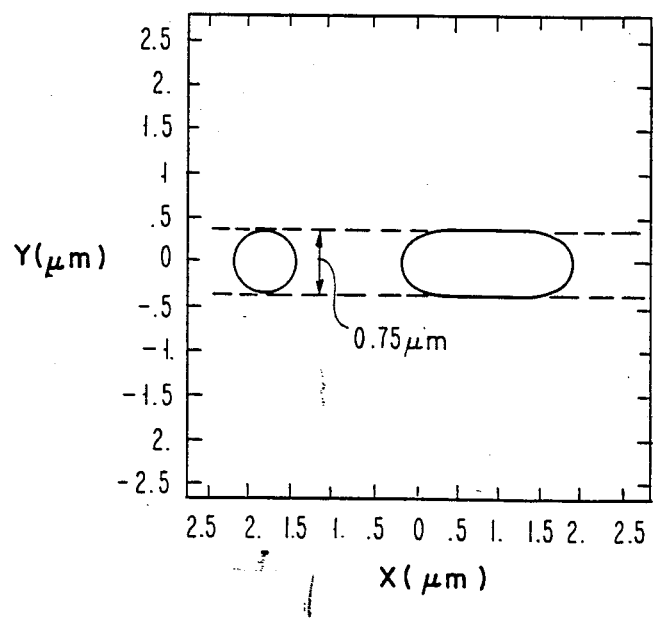

Reference to FIGS. 3C and 3D illustrates simulations of images provided with the halftone mask of the present invention, as illustrated in FIG. 2. The apertures in the 10× mask are divided into 0.8 micron×0.8 micron sub-resolution pixels. Five out of every eight pixels in the line are opaque, while in the contact hole, four are opaque. FIGS. 3C and 3D illustrate that development of either feature of the proper width produces little, if any, error in the other feature. For instance, the smaller proportion of open halftones in the line aperture reduces the exposure of the line image to match that of the contact hole. This exposure correction is obtained by an increase in exposure time.

The opaque halftone can be produced on the mask using standard fabrication processes wherein the resolution of the photolithography used is greater than that to be employed in the subsequent photolithography when the mask is used to develop the desired patterns. However, usually when employing present day state-of-the-art lithography, the resolution needed to make the mask is not necessarily any finer than that used to print on the wafer since the mask is demagnified such as about 5-fold to about 10-fold. For instance, the halftone mask can be provided by placing a layer of, for instance, chrome of about 500 angstroms on a transparent glass substrate followed by a layer of photoresist material. The photoresist is then developed to provide the desired halftone pattern and the chrome beneath the photoresist is etched. The photoresist remaining is then removed.

In addition, halftone pixels can be fabricated in masks that are later de-magnified by the lithographic tool, such as employing a reduction stepper. In the event the 2-dimensional mask pattern is Fourier transformed, such an optical reduction system will not reproduce spacial frequencies having a period finer than $r_{mask} = 0.5M\lambda/NA_{wafer}$ where M is the magnification. In the event the halftone elements are insufficiently small, however, they will generate significant Fourier components at resolvable spacial frequencies, thereby resulting in unacceptable noise in the image. For example, if desired, the halftones can be arrayed in a grating-like pattern. The spacial frequencies in the grating must be chosen to lie outside the imaging bandwidth of the photolithographic tool employed. Ideally, the image cast by the linear or bi-linear optical reduction system would then consist only of the gray-level DC component. However, the corrected mask consists of a multiplication of the high frequency grating with the uncorrected pattern. In particular, noise results from the low frequency harmonics generated by the non-linear multiplication as demonstrated in FIG. 4A. The noise will be localized in the vicinity of feature edges, and is, in fact, equivalent to the intensity change caused by a small shift in the position of the image. The residual noise or intensity change due to the image shift can be made small in comparison to uncorrected optical proximity effects, particularly in cases where the minimum feature size approaches the resolution of the lens employed in the photolithographic tool. In such instances, the halftone pixels are made small in comparison with the lens resolution.

Figure 4A:
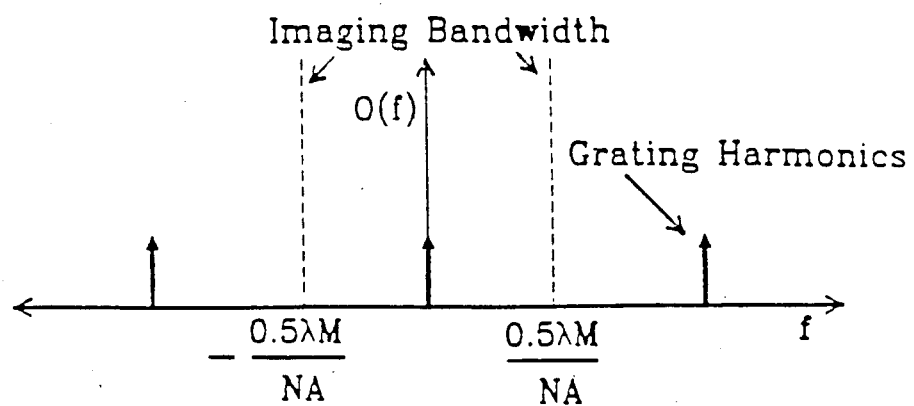
FIGS. 4A–4C illustrate the Fourier domain of halftone-corrected mask patterns pursuant to the present invention.
Figure 4B:
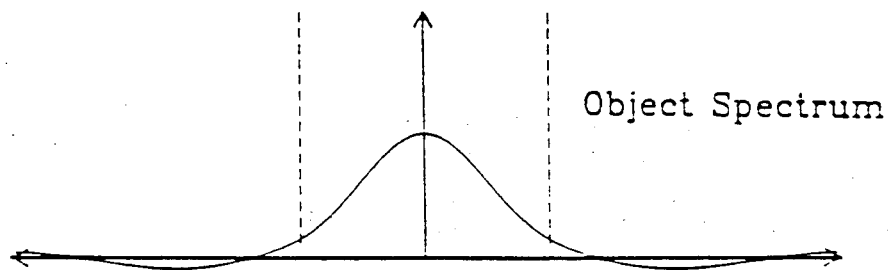
Figure 4C:
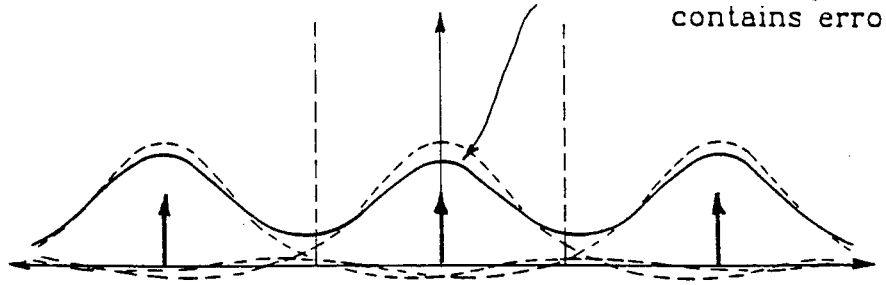

Reference to FIG. 4A illustrates the spectrum of spacial frequencies contained in a grating-like array of halftones. A band-limited optical system will capture only the central DC harmonic, and will then produce the desired uniform image exposure. Reference to FIG. 4B illustrates the spectrum of an uncorrected mask pattern whereby the binary lithographic pattern can not be band-limited. On the other hand, FIG. 4C shows the spectrum of the corrected mask that consists of the convolution of 4A and 4B. A comparison of FIG. 4C with FIG. 4B illustrates the erroneous components in the pattern at resolvable frequencies.

Not only can the present invention and use of halftones be employed to equalize the exposure of different patterns, mask structures in accordance with the present invention can be provided to carry out uniform correction within a pattern itself. For instance, the effective gray level can be varied within an individual mask opening such as for providing higher effective transmission in corners and along edges of an individual mask. This allows for more general improvement in the quality of the image.

Figure 5:
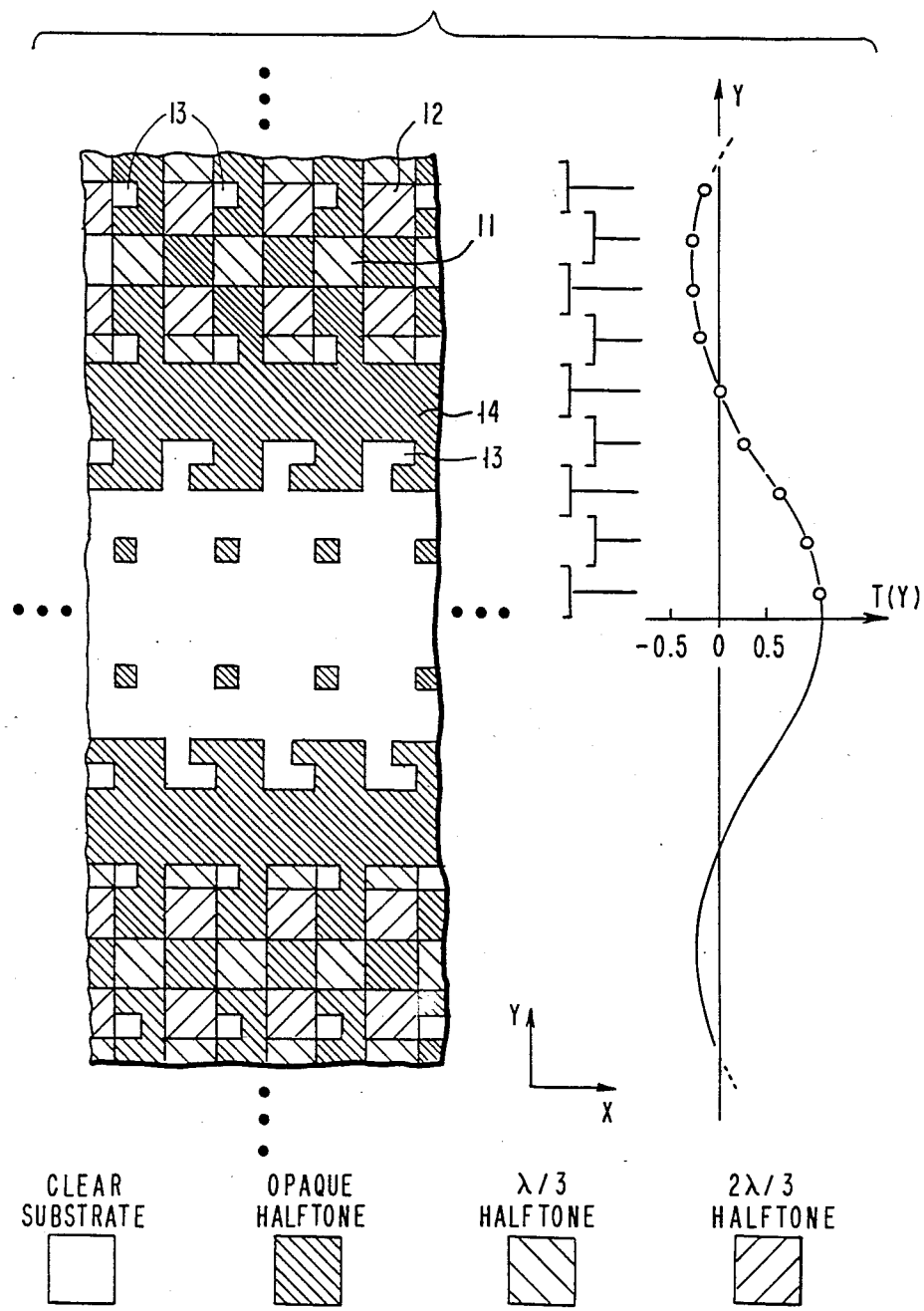
FIG. 5 is a schematic of a mask containing phase halftones pursuant to the present invention.

The techniques of the present invention can be used not only for binary mask-making processes to be used in the fabrication of half-tone masks as described in detail above, but also in conjunction with more sophisticated mask-making processes such as Levenson's phase-layer processes to fabricate an even more general class of mask (e.g., masks with negative or non-real transmittance). Such phase-layer process is disclosed by Levenson, et al., "Improved Resolution and Photolithography with a Phase-Shifting Mask", IEEE Transaction on Electron Devices, ED-29, page 1828 (1982). For instance, see FIG. 5. The technique could provide a super-position of four basic amplitudes to synthesize an arbitrary amplitude in a complex plane. For instance, four different kinds of halftone elements would be sufficient to define an arbitrary net complex transmittance for each resolution element in the mask. for instance, the four elements could include a pixel (11) with a transparent coating of one-third wave optical thickness, a pixel (12) with coating of two-thirds wave thickness, a pixel (13), and an opaque pixel (14) on the un-coated substrate. In FIG. 5, numeral 13 represents the uncoated substrate, regions of which represent a pixel. The uncoated regions are shown as white. The phase and amplitude transmittances of the resulting masks can have a spacial variation that is arbitrary to within the lens resolution. Such masks form the most general class of two-dimensional optical objects. Accordingly, the mask pattern can be chosen such that it most fully corrects for degradation in the lithographic process.

FIG. 5 is a schematic of a mask containing halftones wherein the effective mask transmittance varies in the y direction, but not in the x direction. The net amplitude transmittance T(y) of each x-oriented strip is indicated with an x on the accompanying plot. The negative transmissions shown could not be obtained with opaque halftones alone. Phase halftones make possible a general complex transmittance.

In addition, according to the present invention, methods for determining the maximum allowed pixel size and criteria for such have been provided.

A simple scheme for placing halftone elements within mask apertures is one in which potential sites for halftones are randomly filled with probability p (so that p is the attenuation factor). Finite pixel size then causes the image to contain random shot noise. The signal-to-noise ratio is approximately the square root of the number of halftone features within one resolution element of the lens. If each chip contains a large number of resolution elements, a nominally random placement procedure should be modified so as to preclude rare noise fluctuations of unusually large magnitude.

Another and more preferable approach is to systematically array the halftone elements in a two-dimensional grating.

The intensity error in the vicinity of an edge of a pattern will have a peak of order $$\frac{\Delta I}{I_0} \sim \frac{a_{mask}}{8 r_{mask}} \quad [1]$$

where $a_{mask} = M a_{wafer}$ is the size of a single halftone element, M is the magnification, $r_{mask} = M r_{wafer}$ is the resolution (defined here as $0.5\lambda/NA$), and $I_0$ is the baseline exposure level defined as the intensity inside the image of a large object.

In the absence of correction, the degree of interaction between features having a critical dimension d is of order $$\Delta I \sim \frac{\sin^2(\pi d/2 r_{wafer})}{(\pi d/2 r_{wafer})^2} \quad [2]$$

Eq. 2 may be thought of as the residual lens response at a distance d outside the geometrical boundary of some feature. In contrast, Eq. 1 is essentially the peak lens response to a sub-resolution feature of width a. Eq. 1 is then considerably smaller than Eq. 2 when $a_{mask}$ is small compared to $r_{mask}$ (if d and $r_{wafer}$ are comparable).

The increment represented in Eq. 1 will not fluctuate as with randomly dispersed halftone features. In addition, Eq. 1 represents an upper limit to the error introduced by a halftone grating.

In order to estimate the error introduced when a halftone mask is used in place of a mask containing true gray-levels, reference is made to the simple one-dimensional case in which a half-plane is imaged under incoherent illumination. The region $x<0$ is deemed to be opaque, and the region $x>0$ to be either a continuous film of 50 percent transmittance, or an equal line-space grating of pitch 2a.

Under these conditions, as discussed by Goodman, "Introduction to Fourier Optics", McGray-Hill, Chapter 6, 1968, the image intensity is given by $$I(x_i) = I_0 \int_0^\infty dx_o h(x_i - x_o) g(x_o) \quad [3]$$

where $g(X_o)$ is the mask transmittance, and where, under the assumption of incoherent one-dimensional imaging, the intensity response function is given by $$h(x_1) = \frac{1}{2 r_{wafer}} \frac{\sin^2(\pi x_i/2 r_{wafer})}{(\pi x_i/2 r_{wafer})^2} \quad [4]$$

The intensity difference between the true gray-level image and that generated with halftones is $$\frac{\Delta I}{I} = 0.5 \left[ \int_0^a h(x_i - x_o) - \int_a^{2a} h(x_i - x_o) + \int_{2a}^{3a} h(x_i - x_o) - \int_{3a}^{4a} h(x_i - x_o) \ldots \right] \quad [5]$$

$$\approx -\frac{a}{4} \int_0^\infty dx_o \frac{d}{dx_o} h(x_i - x_o) \quad [6]$$

-continued $$= \frac{a}{\delta r_{wafer}} \frac{\sin^2(\pi x_i/2r_{wafer})}{(\pi x_i/2r_{wafer})^2} \quad [7]$$

which yields Eq. 1 above. Eq. 6 assumes that the halftone pixels are small enough that h can be approximated by a two-term Taylor expansion within each pixel.

The above approach forms the basis of a general two-dimensional calculation in which the illumination can be partially coherent. A general two-dimensional halftone grating that fills a mask aperture of arbitrary shape can be analyzed.

The image amplitude cast through the halftone object by a single source point as discussed by Born, et al., "Principles of Optics", 5th Ed. (Pergamen, Oxford, (1975), Chapter 10, is $$v(x_i;x_s) = \int_{\substack{\text{Aperture}\\\text{Area}}} dA_o/2(x_i - x_o)p(x_o;x_s)S(x_s)g(x_o) \quad [8]$$

where $S(X_s)$ is the strength of a source point at $X_s$, $h(X_i)$ is the amplitude impulse response, $p(X_o; X_s)$ is the amplitude illuminating the object plane due the single source point, and $g(X_o)$ is, as above, the periodic halftone transmittance function. Let the transmittance function in the jth period of the halftone grating be written as $$g(x_o) = \Delta g(\Delta x_o) + g \quad [9]$$

where $$\Delta x_o \equiv x_o - x_{oj} \quad [10]$$

and $$g \equiv \frac{\int_{\text{Period}} dA_o g(x_o)}{\int_{\text{Period}} dA_o} \quad [11]$$

and where $X_{oj}$ in Eq. 10 is defined implicitly by $$\int_{\text{Period}} dA_o \Delta x_o = 0 \quad [12]$$

(i.e., $X_{oj}$ is the geometrical center of the jth halftone period).

The halftone period is assumed to be sufficiently small to permit a two term Taylor expansion of the imaging and illuminating fields within each period. Then changing the variable of integration in Eq. 8 from $X_o$ to $X_o$:

$$v(x_i;x_s) \cong \sum_j S(x_s) \int_{\substack{\text{Jth}\\\text{Period}}} dA_o(\Delta g(\Delta x_o) + g) [A (X_i - \quad [13]$$

$$X_{oj})p(x_{oj};x_s) + \Delta x_o \cdot \nabla(A(X_i - X_{oj})p(X_{oj};x_s))]$$

which (using Eqs. 9 and 12 while integrating over the halftone terms, and approximating the resulting sums of h and p terms by integrals) results in $$v(x_i;x_s) = g S(x_s) \left[ \int_{\substack{\text{Aperture}\\\text{Area}}} dA_o A(x_i - x_o)p(x_o;x_s) + \int_{\substack{\text{Aperture}\\\text{Area}}} dA_o \langle r \rangle \cdot \nabla(A(x_i - x_o)p(x_o;x_s)) \right] \quad [14]$$

$$\langle r \rangle \equiv \frac{\int_{\text{Period}} dA_o \Delta x_o g(x_o)}{\int_{\text{Period}} dA_o g(x_o)} \quad [15]$$

If $d_s$ is a differential vector directed along the edge of the aperture, and z is directed normal to the object plane, then using a version of Stoke's theorem, as discussed by Gradshtlyn, et al., "Table of Integrals", Series 1 and Products and Jeffrey, Academic Press, 1980, entrs. #10.723, p. 1091, Eq. 14 reduces to $$v(x_i;x_s) = gS(x_s) \left[ \int_{\substack{\text{Aperture}\\\text{Area}}} dA_o A(x_j - x_o)p(x_o;x_s) + \langle r \rangle \cdot \int_{\substack{\text{Aperture}\\\text{Edge}}} dm\, A(x_i - x_o)p(x_o;x_s) \right] \quad [16]$$

where $$dm \equiv ds \times z \quad [17]$$

i.e. dm is an infinitesimal vector directed normal to the aperture edge.

Finally, the product VV* is formed and integrated over all source points $X_s$. Using the definition of the mutual coherence $$\mu(x_o;x_o') = \int_{\substack{\text{Source}\\\text{Area}}} dA_s S^2(x_s)g(x_o)p(x_o;x_s)p^*(x_o';x_s) \quad [18]$$

and subtracting the image intensity corresponding to a true continuous-tone film of transmittance gg* is obtained $$\frac{\Delta I}{I}(x_i) = \int_{\substack{\text{Aperture}\\\text{Edge}}} (dm \cdot \langle r \rangle)(dm \cdot \langle r \rangle^*)A(x_i - x_o)A^*(x_i - x_o)\mu(x_o - x_o') + \quad [19]$$

-continued $$2\,Re\left[\int_{\substack{\text{Aperture}\\ \text{Area}}} dA_o \int_{\substack{\text{Aperture}\\ \text{Edge}}} dm \cdot <r>^* A(x_i - x_o) A^*(x_i - x_o)\mu(x_o - x_o')\right]$$

$$\sqrt{\frac{1}{\lambda z^{\frac{1}{2}}}}$$

Eq. 19 indicates that the departure from a true continuous-tone film image may be thought of as an interference between two sources; the continuous-tone film image itself, and an amplitude equivalent to that transmitted by a slit-like opening tracing the feature boundary. The width of this slit is essentially $<r>$, which is of the order of the width of one halftone. As in the example discussed above, this suggests that the residual error is small compared to uncorrected proximity effects.

Equivalently, one may regard the halftone aperture as a continuous-tone film aperture that has been shifted in position a distance $<r>$ since such a shift changes the transmitted amplitude by an edge-like contribution identical to that in Eq. 16. A similar contribution arises when the aperture does not contain an integral number of periods.

A more general non-periodic halftone object can similarly be regarded as a variable transmittance object that has undergone small internal deformations; in the non-periodic case the deformations are inhomogeneous.

In a similar manner, the distribution of the subresolution elements can be determined in the case when the member to receive the image is positioned in proximity of the mask without a lens in-between. In this situation, $h(x_i - x_o)$ is replaced with $$h(X_i - X_o) = \frac{e^{\frac{i2\pi}{\lambda}[(x_i - x_o)^2 + z^2]^{\frac{1}{2}}}}{\frac{2\pi}{\lambda}[(x_i - x_o)^2 + z^2]^{\frac{1}{2}}} \quad [20]$$

where $\lambda$ is the wavelength of the actinic light and $z$ is the distance between the mask and the member. More details on this transfer function $h(x_i - x_o)$ and better transfer functions can be found in Lin, Polymer Eng. and Sci., Vol. 14, p. 1317, 1975 and J. Opt. Soc. Am., Vol. 62, p. 977, 1972. The subresolution element in the case of proximity printing has now a dimension smaller than

Having thus described our invention, what we claim as new and desire to secure by Letters Patent is:

1. A lithographic process having improved image quality that comprises:
   positioning a member including a photosensitive layer at the imaging plane of a projection lens with respect to a lithographic mask that defines areas that are to receive actinic light wherein said lithographic mask includes a plurality of opaque elements or transparent elements, each of which is smaller than the resolution of the projection lens, to be employed for controlling the transmittance of the actinic light defining area, and wherein the concentrations of said elements are varied within an individual mask opening to provide higher transmission in the corners and along the edges of said individual mask opening.

2. The lithographic process of claim 1 wherein said mask includes a plurality of opaque elements.

3. The lithographic process of claim 1 wherein said elements include half-tones, semi-transparent half-tones, or phase shifting regions or a combination of any of them.

4. A lithographic proximity printing process having improved image quality that comprises:
   positioning a member including a photosensitive layer in proximity to a lithographic mask that defines areas that are to receive actinic light wherein said lithographic mask includes a plurality of opaque elements or transparent elements, each of which is smaller than the resolution of the proximity printing, to be employed for controlling the transmittance of the actinic light defining area, and wherein the concentrations of said elements are varied within an individual mask opening to provide higher transmission in the corners and along the edges of said individual mask opening.

5. The lithographic process of claim 4 wherein said mask includes a plurality of opaque elements.

6. The lithographic process of claim 4 wherein said elements include half-tones, semi-transparent half-tones, or phase shifting regions or a combination or any of them.

* * * * *